(12) United States Patent
Götzen

(10) Patent No.: US 8,042,267 B2
(45) Date of Patent: Oct. 25, 2011

(54) METHOD FOR PRODUCING MICROSYSTEMS

(75) Inventor: Reiner Götzen, Duisburg (DE)

(73) Assignee: microTec Gesellschaft für Mikrotechnologie mbH, Duisburg (DE)

( * ) Notice: Subject to any disclaimer, the term of this patent is extended or adjusted under 35 U.S.C. 154(b) by 276 days.

(21) Appl. No.: 10/542,237

(22) PCT Filed: Feb. 13, 2003

(86) PCT No.: PCT/DE03/00419

§ 371 (c)(1),
(2), (4) Date: Jul. 15, 2005

(87) PCT Pub. No.: WO2004/070835

PCT Pub. Date: Aug. 19, 2004

(65) Prior Publication Data

US 2006/0072295 A1     Apr. 6, 2006

(30) Foreign Application Priority Data

Jan. 17, 2003 (DE) .................................. 103 01 612

(51) Int. Cl.
  *H05K 3/00* (2006.01)
  *H05K 3/10* (2006.01)
  *H05K 3/46* (2006.01)
(52) U.S. Cl. ............... 29/848; 29/832; 29/841; 29/846; 174/251; 174/260; 174/261; 361/761
(58) Field of Classification Search .................. 29/930, 29/831, 832, 841, 848, 851, 855, 856–858, 29/30, 830; 174/250, 251, 255, 260, 263, 174/264; 361/761, 763, 764
See application file for complete search history.

(56) References Cited

U.S. PATENT DOCUMENTS

| 3,712,735 A | | 1/1973 | Crumley et al. | ............... 427/510 |
| 4,069,916 A | * | 1/1978 | Fowler et al. | ................. 206/716 |
| 4,383,363 A | * | 5/1983 | Hayakawa et al. | ............. 29/847 |

(Continued)

FOREIGN PATENT DOCUMENTS

DE    3925455 A1 * 2/1991

(Continued)

OTHER PUBLICATIONS

Machine Translation of DE3925455.*

(Continued)

*Primary Examiner* — Livius R Cazan
(74) *Attorney, Agent, or Firm* — Collard & Roe, P.C.

(57) ABSTRACT

The invention relates to a method for producing microsystems comprising microelectronic components that are inserted into cavities created during the layered construction of a base body consisting of a photocurable material, said components being situated adjacent to and/or above one another on several planes and being interconnected either electrically or thermally. The invention is characterised in that once said microelectronic components have been inserted, the layered construction of the base body continues and that a structure is constructed consisting of an electrically or thermally conductive material that projects vertically above the contacts (pads) of the electronic component, said conductive material producing a direct connection to an additional electronic component above the first electronic component or to one or several additional electronic components that is or are located at a lateral distance from said first component by means of a conductor track that runs horizontally from the conductive material projecting vertically above the pad.

4 Claims, 5 Drawing Sheets

U.S. PATENT DOCUMENTS

Figure 1:
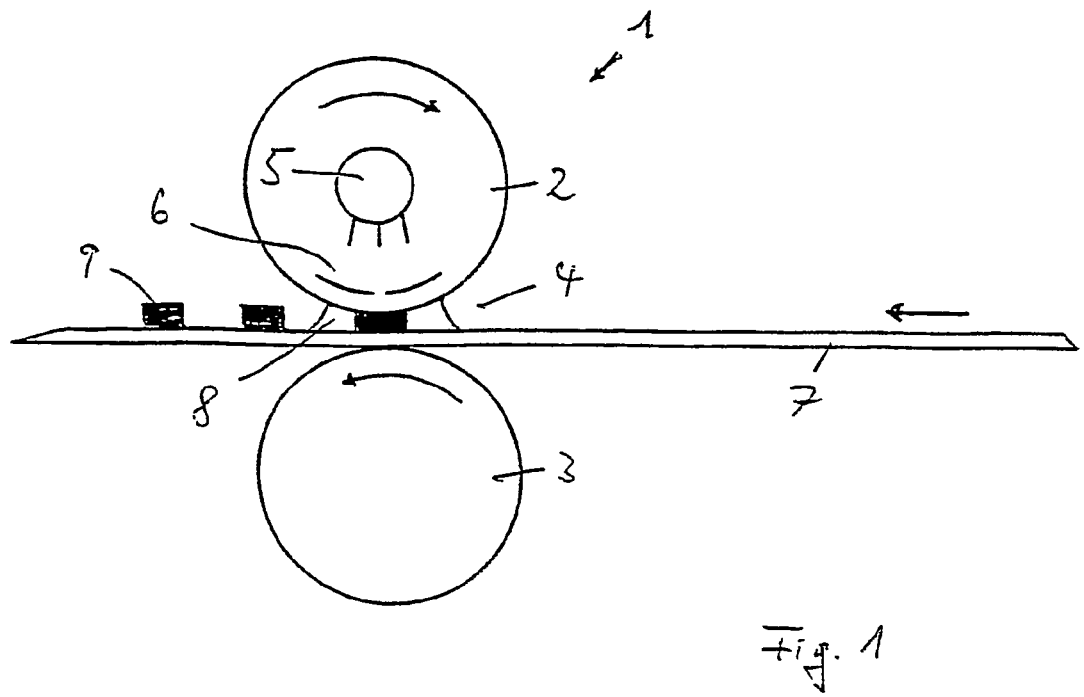

| | | | |
|---|---|---|---|
| 5,869,395 A * | 2/1999 | Yim | 438/637 |
| 6,002,592 A | 12/1999 | Nada et al. | 361/760 |
| 6,160,714 A | 12/2000 | Green | 361/761 |
| 6,373,000 B2 * | 4/2002 | Nakamura et al. | 174/264 |
| 6,495,214 B1 | 12/2002 | Nentwich | 355/85 |
| 6,833,613 B1 * | 12/2004 | Akram et al. | 257/686 |

FOREIGN PATENT DOCUMENTS

| | | |
|---|---|---|
| DE | 42 23 371 | 1/1994 |
| DE | 4420996 A1 * | 1/1996 |
| DE | 44 20 996 | 4/1998 |
| DE | 198 26 971 | 1/2000 |
| DE | 19826971 A1 * | 1/2000 |
| DE | 198 47 088 | 5/2000 |
| DE | 101 44 579 | 12/2003 |
| WO | WO 00 67538 | 11/2000 |

OTHER PUBLICATIONS

Machine Translation of DE4420996.*
Machine Translation of DE19826971.*

* cited by examiner

METHOD FOR PRODUCING MICROSYSTEMS

CROSS REFERENCE TO RELATED APPLICATIONS

Applicant claims priority under 35 U.S.C. §119 of German Application No. 103 01 612.0 filed on Jan. 17, 2003. Applicant also claims priority under 35 U.S.C. §365 of PCT/DE2003/000419 filed on Feb. 13, 2003. The international application under PCT article 21(2) was not published in English.

The invention relates to a method for producing microsystems having microelectronic components inserted, adjacent to and/or above one another, into cavities created during the layered construction of base bodies composed of photocurable material, which components are connected with one another so as to be electrically or thermally conductive.

Furthermore, the invention relates to a device for implementing the method.

The layered construction of microstructures and complex microsystems consisting of photocurable material is known, for example, from DE patent 44 20 996. In the case of the method described there, a photocurable liquid is held between two plane-parallel plates solely by means of the surface tension. One of the plates is permeable for electromagnetic waves.

The 3D model is stored in a PC, broken down into individual layers. By calling up the individual layers, the layer structure is transferred through the plane-parallel plate to the adjacent liquid layer by means of a source that emits electromagnetic waves.

Exposed areas cure, when this happens, while the non-exposed regions, which remain liquid, are removed. After production of this layer, the plates are moved apart by an additional layer thickness, causing liquid to flow in, and another exposure process can take place.

Using this technique, however, it is not possible to produce microstructures in great numbers, since only a limited number of microstructures can be generated in each device, in each instance.

Therefore the inventor has proposed, in the patent application 101 44 579.2, which was not published prior to this application, to provide a roller pair, which can be followed by additional roller pairs, in place of the plane-parallel plates.

With this device, the individual layers of the structure to be built up are generated between two rollers that stand opposite one another, forming the delimitation surfaces, in each instance, whereby the distance between the rollers of the roller pair, in each instance, is determined by the thickness of the layer to be formed and the thickness of the layers that already exist. In this connection, the first layer is applied to a substrate carrier film that passes through between the rollers, and the exposure of the layer to be generated takes place by means of one of the rollers.

This roller contains the source that emits electromagnetic waves. Exposure of the photocurable liquid present between the rollers takes place by means of a mask that corresponds to the layer structure, in each instance, which can be applied to the surface of the exposure roller, in each instance, but can also be passed through between the rollers of the roller pair, as a separate film.

In such a device, the roller pairs are followed by rinsing devices in which the material that has not cured is rinsed out. Additional stations are provided in order to fill cavities that are present in the structure that has already been built up, with electronic components, for example. After insertion of the electronic component, in each instance, construction of the microstructure is then continued. Such a method is reminiscent of rotation printing, and has the advantage in common with the latter of producing large "editions" in a very short period of time.

Until now, however, it is difficult to connect the individual electronic components with one another so as to be electrically or thermally conductive; this holds true both for electronic components in the same plane and for electronic components in different planes.

The invention is therefore based on the task of conducting a method of the type stated initially in such a manner that while the microstructure is being built up, at the same time, the electrically or thermally conductive connections between individual electronic components can take place.

The invention accomplishes this task in that after the insertion of the electronic component, layered construction of the base body is continued, but that a structure of electrically/thermally conductive material is built up, vertically rising, above the contacts (pads) of the electronic component, whereby this conductive material produces a direct connection with another electronic component disposed above the electronic component, or by means of a horizontally running conductive track of conductive material rising from the pad to one (several) other electronic component(s) disposed at a lateral distance from the electronic component.

The present invention therefore makes it possible to generate the conductive connections both in the vertical and in the horizontal direction, without interruption of the structure construction of the microsystem, practically integrated into the method.

In the alternative it is proposed that the conductive, vertically rising structure is generated in openings in consecutive layers that are left clear above the pads, by means of screen printing, in which connection the openings left in the layers of photocurable material, above the pads, are filled with the electrically conductive material, and finally the horizontally running conductive track is printed.

An electrically conductive adhesive has proven to be particularly suitable for this screen-printing method. Because of the properties of the adhesive, a good electrical contact to the pad is obtained, for one thing, and of the layers to one another, during the construction of the conductive structure.

The horizontally running conductive tracks lead to a component disposed laterally relative to the first component. By continuing the method, the structure can then be built up further, whereby now additional connections upward are produced from this laterally disposed component.

For faster curing of the conductive adhesive, a heat source is provided, which can consist, for example, of a pass-through oven.

In order to be able to achieve great packing densities in the case of the microsystems produced in this manner, it is desirable that the electronic components can be contacted not only from above, as just described, but that there is also a possibility of contacting from below. This means that a direct electrically conductive connection can be produced between electronic components (chips, for example).

This preferably takes place in that the electrically conductive vertically rising structure consists of a small pile of soldering paste that is applied to the pad, in each instance, through the corresponding opening of a template, which small pile is formatted into a solder bead (bump) in the subsequent step, after removal of the template, by means of heating, and after further layered construction of the base body and production of a corresponding cavity, another electronic component is inserted into the latter, in such manner that the bumps previously produced are connected with the pads of the second component by means of heating.

In this manner, a chip having the pads facing upwards is connected with a chip disposed above it, having the pads facing downwards.

A second heating of the bumps can take place in a subsequent roller stand, in which a roller is provided with a heating device.

Although the production of the corresponding bumps was presented using the method in the present case, there is also the possibility of producing such a structure by means of the method that has been described in DE patent 44 20 996.

Of course the methods can be combined with one another, so that first of all, the work is performed using the screen-printing technique (conductive adhesive), and subsequently (if two electronic components are supposed to be connected with one another directly above one another), by means of the "bump technique."

Other embodiments and/or further developments of the invention are evident.

The invention will be presented and explained in detail, using drawings.

These show:

FIG. 1 roller pair in the production of a first substrate layer

Figure 2:
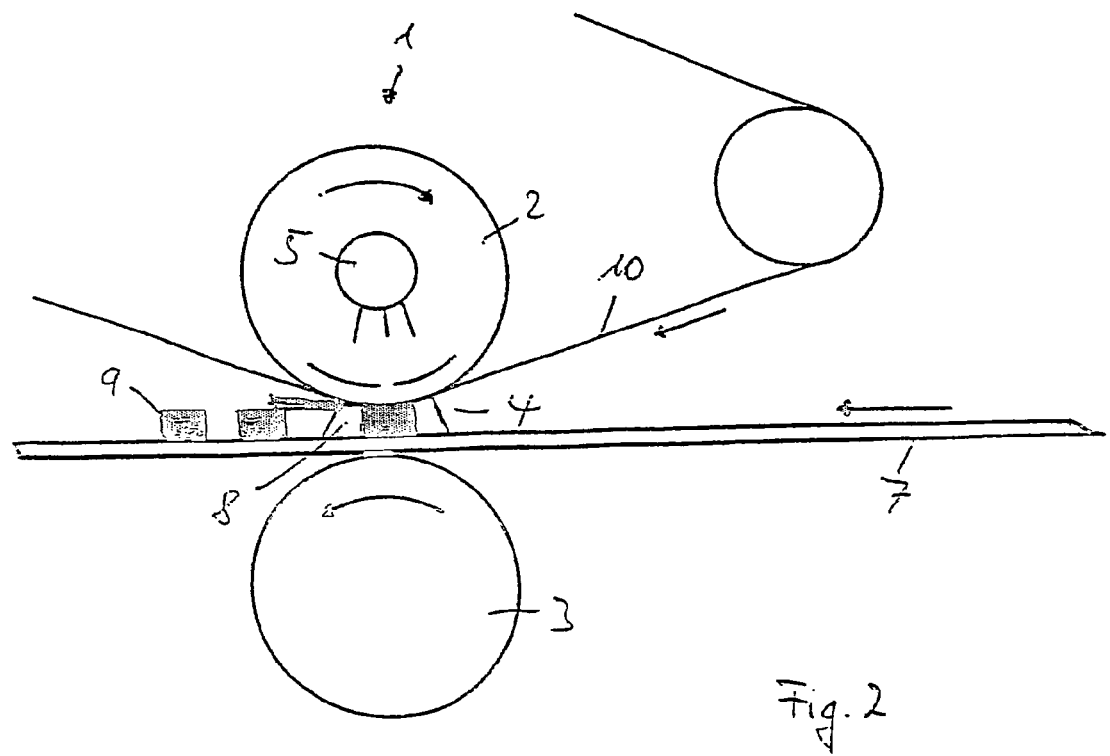

FIG. 2 roller pair according to FIG. 1 with mask film

Figure 3:
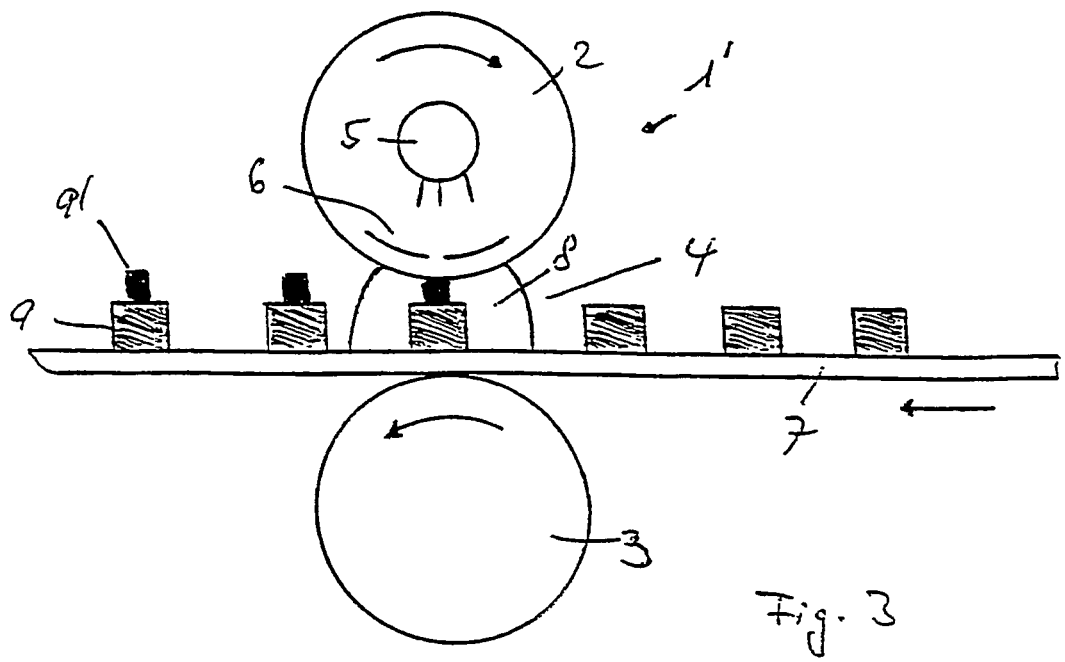

FIG. 3 roller pair in the production of the second layer

Figure 4:
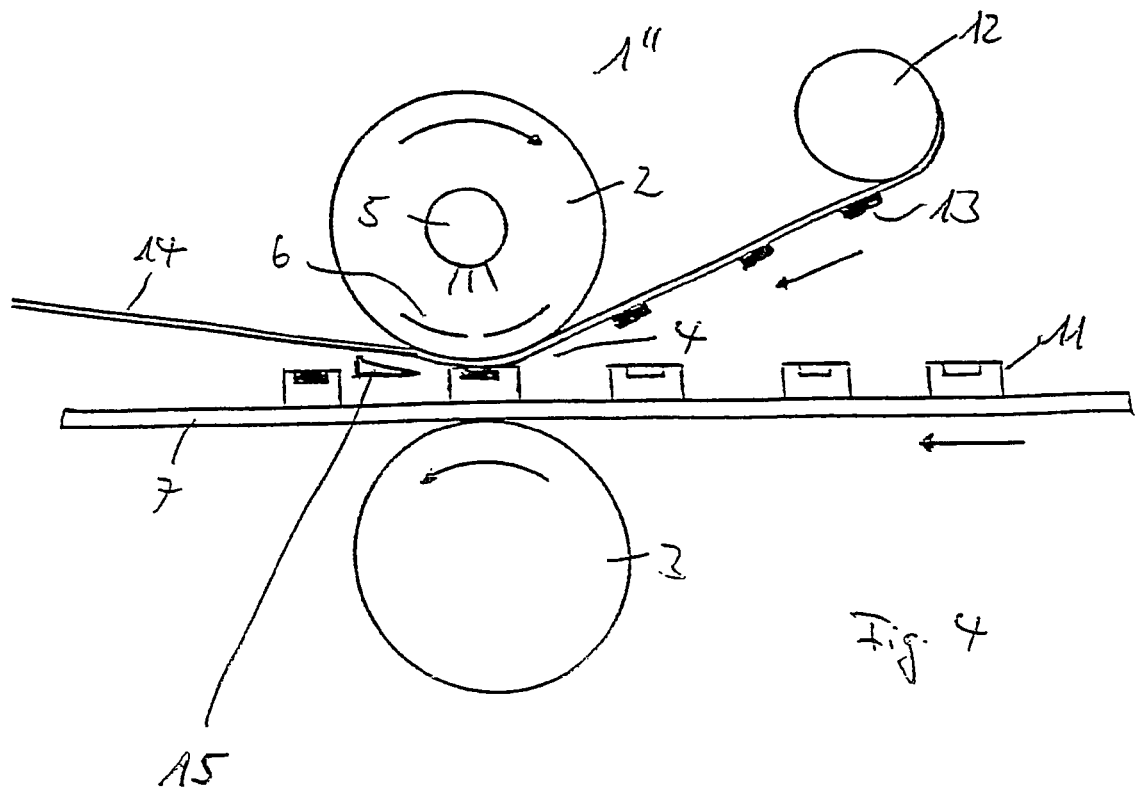

FIG. 4 roller pair and feed device of components to be inserted

Figure 5:
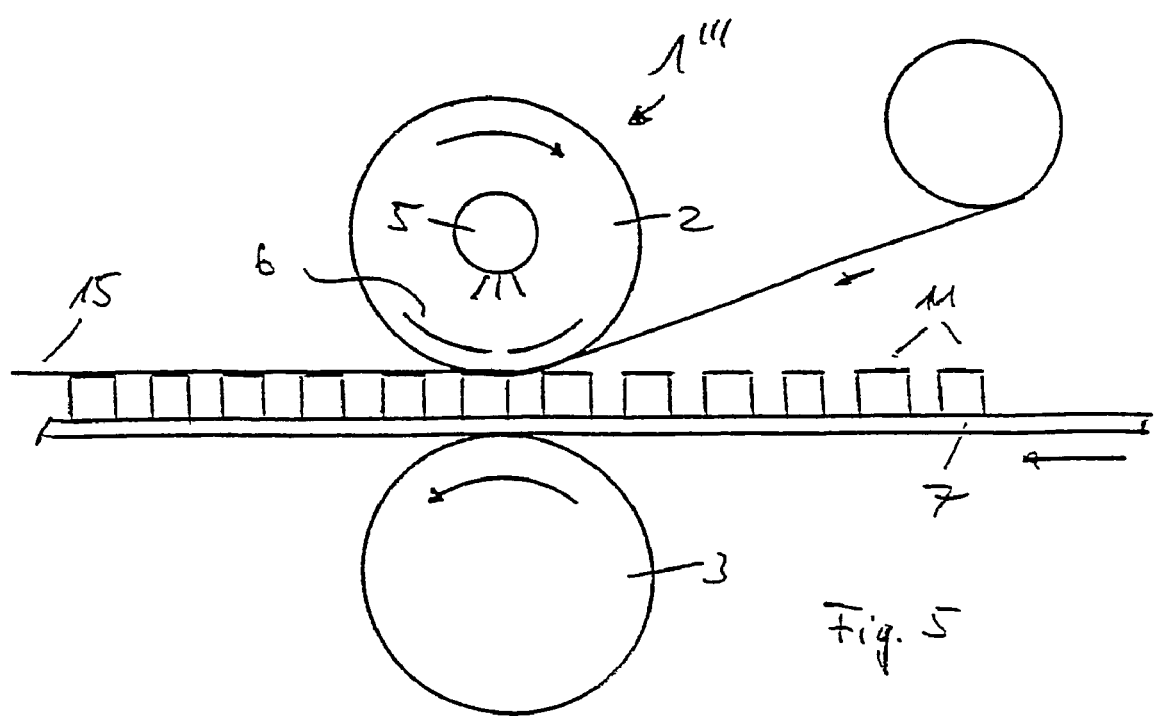

FIG. 5 roller pair with feed of a film

Figure 6:
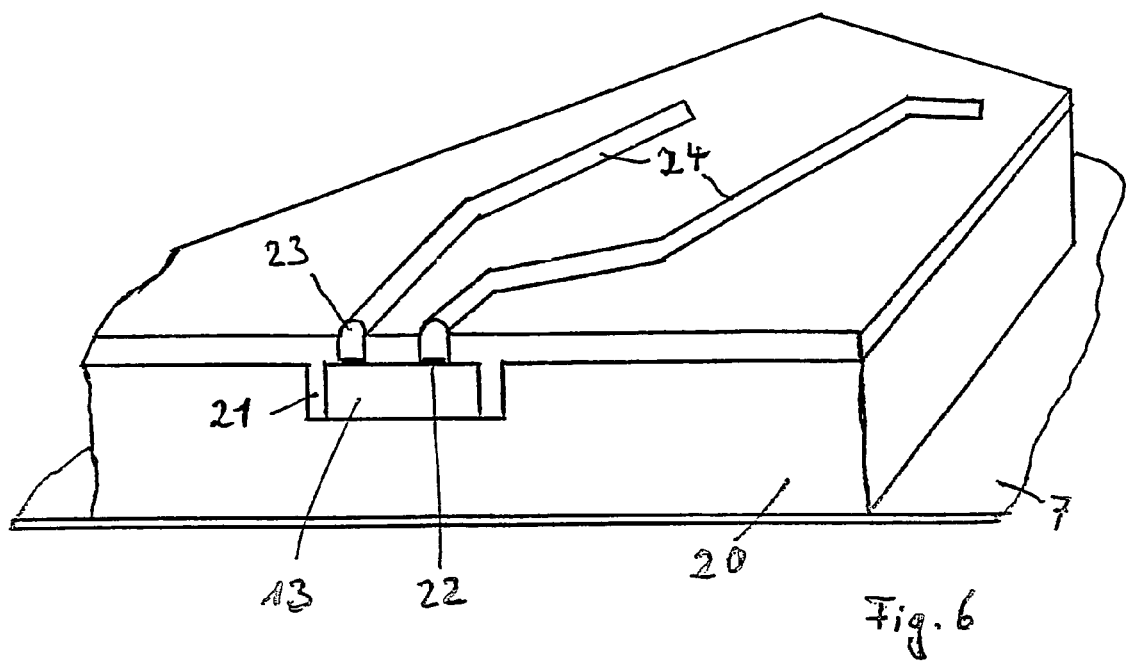

FIG. 6 construction of a structure of photocurable material with conductive tracks of conductive glue FIG. 7*a-e* method steps for the production of a conductive connection between two electronic components, one on top of the other.

A roller pair is shown in FIGS. 1 to 5, in each instance, and provided, in general, with the reference symbol 1. For the device according to the invention, one must imagine n of these roller pairs switched in series with one another, whereby n is dependent on the structure height or on the properties that such a structure is supposed to have. Alternatively, however, a roller pair in which the distance between the rollers is increased by the layer thickness during each pass can also be provided.

In FIG. 1, the first roller pair is shown within the device. It consists (as do the other roller pairs, as well, in principle) of an exposure roller 2 that is permeable for electromagnetic waves, and a counter-roller 3, which leave a roller nip 4 between them. A source 5 that emits electromagnetic waves (UV source, laser, etc.) is disposed in the exposure roller 2. A stationary exposure slot 6 is located in the roller 2, between the light source 5 and the roller nip 4. A substrate carrier film 7 is passed through the roller nip, and a photocuring liquid 8 is provided between the film and the exposure roller 2, held in place by adhesion forces. A mask (for example a chrome/glass mask) is applied to the surface of the exposure roller 2, which mask represents a negative of the layer topography of the first layer to be produced.

The liquid 8 is exposed using the light source 5, through the exposure slot 6. In those locations where the light can penetrate into the liquid (i.e. is not blocked by the mask), the liquid polymerizes and becomes solid. This results in the first layer 9 of the structure to be generated.

FIG. 2 shows a device that is essentially the same. Here, however, the mask is not applied to the surface of the exposure roller 2, but rather it is passed through between the exposure slot and the surface of the liquid, in the form of an exposure film 10.

FIG. 3 shows a roller pair 1' that follows the roller pair 1 shown in FIGS. 1 and 2, by means of which the second layer 9' is generated on top of the first layer 9, in the same manner as described with regard to FIGS. 1 and 2. In this connection, the substance for producing the second layer 9' can be the same as the substance of the first layer 9, but can also consist of a material having different properties.

FIG. 4, in turn, shows a roller pair 1", at which the structures 11 previously generated, already provided with a trough, arrive, and there are fitted with components 13 that are supplied by a coil 112 (for example). The components 13 adhere to a film 14. After the components 13 have been laid into the troughs of the structure 11, they are peeled off the film 14 by means of a peeling blade 16. To attach the parts 13 in the trough, gluing techniques can be used, in which the work is also performed with photocurable substances, specifically in the manner as described above.

Finally, FIG. 5 shows a final roller pair 1''', in which the finished structures 11 are covered with a cover film 15, for protection and transport. Here again, gluing of the film to the structures 11 can take place by means of the method described above.

Films that then form individual layers in the structure can also be supplied during the production, i.e. during the generation of the structures 11, as a function of chemical, physical, and biological properties, similar to what is shown in FIG. 5.

However, the invention is not limited to the embodiments shown in FIGS. 1 to 5.

FIG. 6 shows a structure of a microsystem that is already far advanced, which is constructed on a film in layers. The constructed base body is provided with the reference symbol 20. During the construction of the base body 20, a cavity 21 is left in it, into which an electronic component 13 (in this case a microchip) has been inserted. During the further construction of the base body structure 20, openings are left in the individual layers, above the pads 22, which are filled, layer by layer, by means of a conductive adhesive, using the screen-printing method. Thus, a vertically rising structure 23 of a conductive material is formed, from which (as shown in the drawing) a conductive track 24 that runs horizontally is then applied to the currently last layer of the base body 20, also using the screen-printing method. This conductive track (or these conductive tracks) lead(s) to other electronic components or to lateral contacts, thereby implementing electronic functions.

FIG. 7 shows how two electronic components (in this case two microchips) can be directly connected with one another in conductive manner, vertically above one another.

Figure 7A:
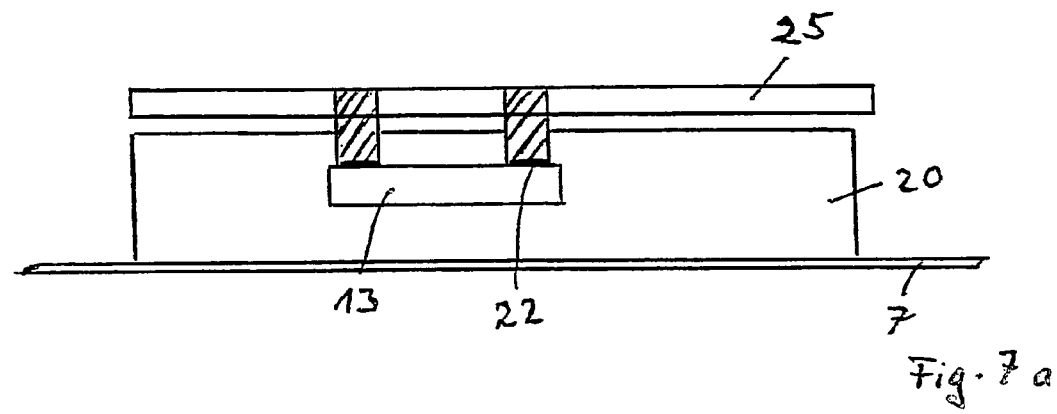

FIG. 7*a* shows the status in which, similar to FIG. 6, a base body 20 is constructed on the film 7, in which a microchip 13 has already been inserted into a corresponding cavity. The electrical connections (pads) 22 point upward. Above these pads 22, openings are left in the material of the base body 20, which correspond with openings in a template 25. Soldering paste is now applied above the openings of the template 25, which fills the space above the pads 22.

Figure 7B:
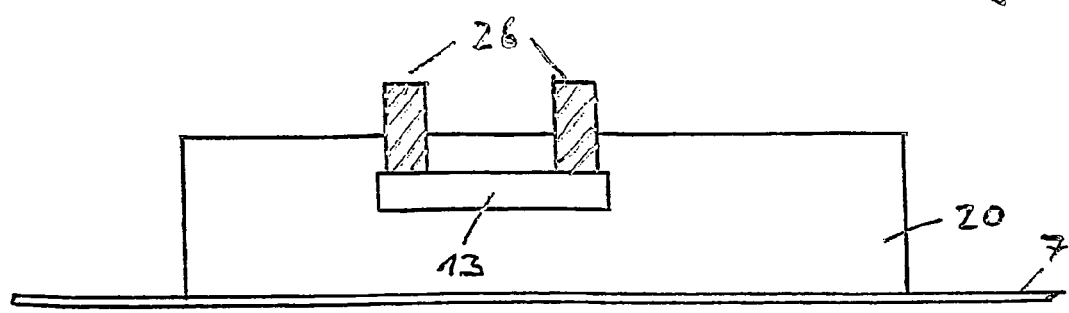

FIG. 7*b* shows the status after removal of the template 25. Small piles 26 of soldering paste have been left behind above the pads 22.

Figure 7C:
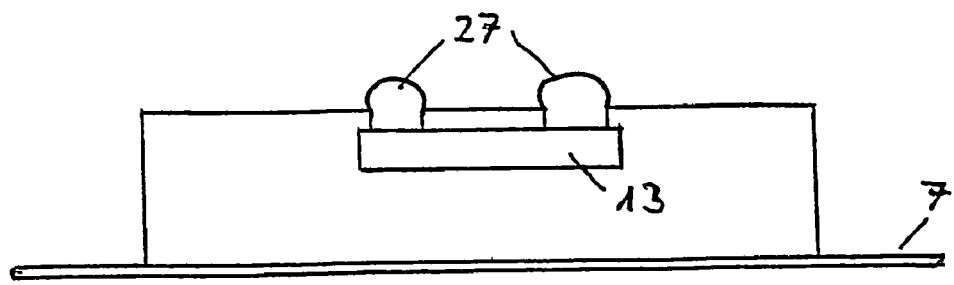

In a subsequent station, the small piles 26 of soldering paste are heated up, so that the soldering paste becomes liquid and forms so-called bumps 27. This status is shown in FIG. 7*c*.

Figure 7D:
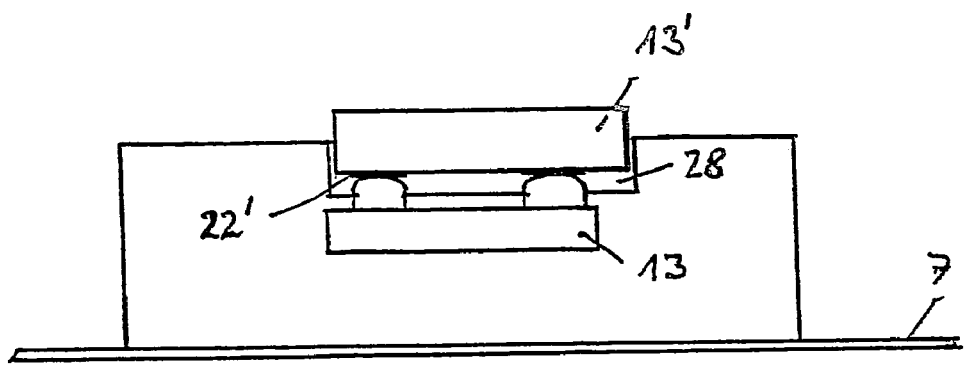

In FIG. 7*d*, the base body 20 has been built up further, whereby an additional cavity 28 has been formed, into which another microchip 13' is now placed, with the pads 22' facing downward. The pads 22' rest on the solder bumps 27, which have solidified again.

In a subsequent roller device, in which one of the rollers is provided with a heating device, the second microchip 13' is now pressed into the cavity 28, whereby the solder bumps become liquid again, as a result of the heating, and produce an electrical contact with the pads 22'.

Figure 7E:
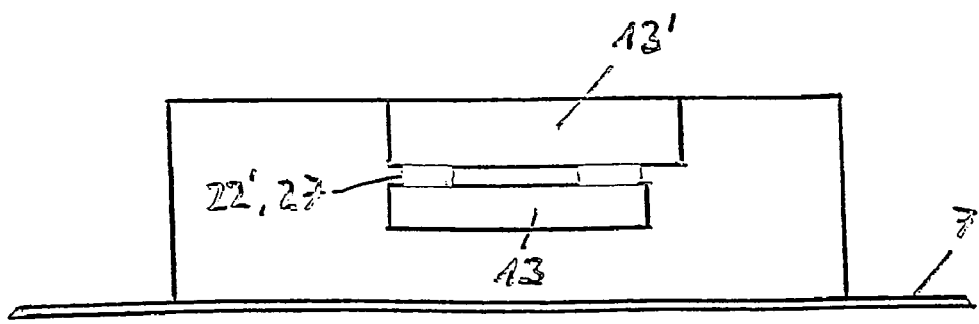

This status is shown in FIG. 7e.

Accordingly, the further layered construction of the microstructure, i.e. of the microsystem can proceed as just described, whereby the alternatives from FIG. 6 and FIG. 7a to e can also be combined with one another.

The invention claimed is:

1. A method for producing a microsystem including electrically or thermally interconnected electronic components inserted adjacent to or above one another in cavities created during layered construction of a body composed of photocurable material, the method comprising the steps of:
   (a) inserting a first electronic component into a cavity created during the layered construction of the body, the first electronic component comprising first and second contacts; and
   (b) after insertion of the first electronic component, continuing the layered construction of the body to form a structure of an electrically or thermally conductive material that projects vertically above the contacts of the first electronic component, the conductive material producing a direct connection to at least a second electronic component above the first electronic component or at a lateral distance from the first electronic component by a horizontally extending conductive track;
   wherein the layered construction takes place between at least one pair of rollers, layer by layer, wherein forming a particular layer comprises filling the space between the rollers of the at least one pair of rollers with a photocurable liquid and exposing the photocurable liquid through a mask provided on one of the rollers of the at least one pair of rollers to cure certain portions of the photocurable liquid into solid material;
   wherein behind this roller pair, uncured photocurable liquid is washed out;
   wherein after completion of layered construction of the body, a horizontally extending conductive track is printed by means of screen printing with a screen printing device; and
   wherein at least one heating device follows the at least one pair of rollers.

2. The method according to claim 1, wherein the structure that projects vertically above the contacts of the first electronic component is an electrically conductive material and contacts are formed in openings in consecutive layers of the photocurable material by screen printing, the openings being filled with the electrically conductive material before printing the horizontally extending conductive track.

3. The method according to claim 2, wherein the conductive material is an adhesive.

4. The method according to claim 1, wherein the structure that projects vertically is an electrically conductive structure comprising a small pile of soldering paste that is applied to each contact through a corresponding opening of a template, each of said small pile being formatted into a respective solder bead in a subsequent step, after removal of the template, by heating, and after further layered construction of the body and production of a corresponding cavity, the second electronic component is inserted into the corresponding cavity so that each bead previously produced is connected with contacts of the second component by heating.

\* \* \* \* \*